US010870576B2

(12) United States Patent
Hu et al.

(10) Patent No.: US 10,870,576 B2
(45) Date of Patent: Dec. 22, 2020

(54) SEMICONDUCTOR SENSOR AND METHOD OF MANUFACTURING THE SAME

(71) Applicant: UNITED MICROELECTRONICS CORP., Hsinchu (TW)

(72) Inventors: Chih-Fan Hu, Taoyuan (TW); Chia-Wei Lee, Kaohsiung (TW); Chang-Sheng Hsu, Hsinchu (TW); Weng-Yi Chen, Zhubei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/824,153

(22) Filed: Mar. 19, 2020

(65) Prior Publication Data

US 2020/0216304 A1 Jul. 9, 2020

Related U.S. Application Data

(63) Continuation of application No. 15/293,855, filed on Oct. 14, 2016, now Pat. No. 10,640,368.

(30) Foreign Application Priority Data

Aug. 26, 2016 (TW) .............................. 105127460 A

(51) Int. Cl.
*B81B 7/00* (2006.01)
*G01N 27/12* (2006.01)
*B81B 3/00* (2006.01)

(52) U.S. Cl.
CPC ............ *B81B 7/007* (2013.01); *B81B 3/0081* (2013.01); *G01N 27/128* (2013.01);
(Continued)

(58) Field of Classification Search
CPC ... B81C 1/00301; B81B 7/007; B81B 3/0081; B81B 2207/012; B81B 2201/0292; B81B 2201/0214; B81B 2207/07; G01N 27/128
See application file for complete search history.

(56) References Cited

U.S. PATENT DOCUMENTS 4,792,433 A 12/1988 Katsura et al.
6,111,280 A 8/2000 Gardner et al.
(Continued)

FOREIGN PATENT DOCUMENTS

TW 201436237 9/2014

OTHER PUBLICATIONS

Office action issued by TIPO dated Oct. 1, 2019.

*Primary Examiner* — Sue A Purvis
*Assistant Examiner* — Sun Mi Kim King
(74) *Attorney, Agent, or Firm* — WPAT, PC

(57) ABSTRACT

A semiconductor sensor, comprising a gas-sensing device and an integrated circuit is provided. The gas-sensing device includes a substrate having a sensing area and an interconnection area in the vicinity of the sensing area, an inter-metal dielectric (IMD) layer formed above the substrate in the sensing area and in the interconnection area, and an interconnect structure formed in the interconnection area; further includes a sensing electrode, a second $TiO_2$-patterned portion, and a second Pt-patterned portion on the second $TiO_2$-patterned portion in the sensing area. The interconnect structure includes a tungsten layer buried in the IMD layer, wherein part of a top surface of the tungsten layer is exposed by at least a via. The interconnect structure further includes a platinum layer formed in said at least the via, a $TiO_2$ layer formed on the IMD layer, a first $TiO_2$-patterned portion and a first Pt-patterned portion.

10 Claims, 9 Drawing Sheets

(52) U.S. Cl.
CPC ............... *B81B 2201/0214* (2013.01); *B81B 2201/0292* (2013.01); *B81B 2207/012* (2013.01); *B81B 2207/07* (2013.01)

(56) References Cited

U.S. PATENT DOCUMENTS

| | | |
|---|---|---|
| 6,191,459 B1 | 2/2001 | Hofmann et al. |
| 7,045,071 B2 | 5/2006 | Kweon et al. |
| 7,495,300 B2 | 2/2009 | Gardner et al. |
| 8,609,491 B2 | 12/2013 | Hwang |
| 2004/0129670 A1 | 7/2004 | Kweon et al. |
| 2006/0154401 A1 | 7/2006 | Gardner et al. |
| 2008/0233752 A1 | 9/2008 | Ko et al. |
| 2013/0307153 A1 | 11/2013 | Edelstein et al. |
| 2015/0037974 A1 | 2/2015 | Lu et al. |
| 2016/0086805 A1 | 3/2016 | Xu et al. |
| 2017/0066646 A1 | 3/2017 | Cheng et al. |

SEMICONDUCTOR SENSOR AND METHOD OF MANUFACTURING THE SAME

This is a Continuation of U.S. application Ser. No. 15/293,855, filed Oct. 14, 2016, which claims the benefit of Taiwan application Serial No. 105127460 filed Aug. 26, 2016, the subject matter of which is incorporated herein by reference.

BACKGROUND

Technical Field

The disclosure relates in general to a semiconductor sensor, and more particularly to a semiconductor sensor having a gas-sensing device and a method of manufacturing the same.

Description of the Related Art

Micro-electro-mechanical systems (MEMS) devices are widely used in a variety of products with smaller sizes, such as micro-acoustical sensor, a gyro-sensor, an accelerometer, a gas sensor, or a clock generation and oscillator. A semiconductor sensor (such as a CMOS sensor MEMS Microhotplates) has provided a technology for metal oxide (MOX) gas-sensing device, by enabling sensor miniaturization, significantly lower power consumption and reach ultra-fast response time for a wide range of application. The hotplate of the gas-sensing device acts a heating element for an oxide-based sensing material. Resistance of the oxide-based sensing material will change due to reaction to selected gas and concentrations at temperature between 1500 to 4500.

It is known that the structures and process for fabricating the semiconductor sensor such as the gas-sensing device will have effects on the properties and performances of the semiconductor sensor; for example, stabilities of the structure and material layers during operation.

SUMMARY

The disclosure is directed to a semiconductor sensor having a gas-sensing device and a method of manufacturing the same for improving the properties and performance of the semiconductor sensor.

According to one aspect of the present disclosure, a semiconductor sensor, comprising a gas-sensing device and an integrated circuit electrically connected to the gas-sensing device, is provided. The gas-sensing device includes a substrate having a sensing area and an interconnection area in the vicinity of the sensing area, an inter-metal dielectric (IMD) layer formed above the substrate in the sensing area and in the interconnection area, and an interconnect structure formed in the interconnection area. The interconnect structure includes a tungsten layer buried in the IMD layer, wherein part of a top surface of the tungsten layer is exposed by at least a via. The interconnect structure further includes a platinum layer formed in said at least the via, and a $TiO_2$ layer formed on the IMD layer adjacent to said at least the via. The platinum layer is directly formed on the $TiO_2$ layer above the IMD layer. The interconnect structure further includes a first $TiO_2$-patterned portion and a first Pt-patterned portion formed on the first $TiO_2$-patterned portion. The first $TiO_2$-patterned portion is formed on the top surface of the tungsten layer and exposing said part of the top surface of the tungsten layer corresponding to said at least the via. The first Pt-patterned portion directly contacts said part of the top surface of the tungsten layer, wherein the platinum layer in said at least the via directly contacts the first Pt-patterned portion. The gas-sensing device further includes a sensing electrode formed on the IMD layer in the sensing area, a second $TiO_2$-patterned portion formed in the sensing area, and a second Pt-patterned portion directly formed on the second $TiO_2$-patterned portion in the sensing area. The sensing electrode includes a patterned $TiO_2$ layer formed above the IMD layer, and a patterned platinum (Pt) layer formed above the patterned $TiO_2$ layer. The second $TiO_2$-patterned portion is buried in the IMD layer and positioned below the sensing electrode. The second Pt-patterned portion acts as a heater of the gas-sensing device.

According to another aspect of the present disclosure, a method of manufacturing a semiconductor sensor is provided, comprising forming a gas-sensing device and an integrated circuit and electrically connecting the gas-sensing device to the integrated circuit, and a method of manufacturing the gas-sensing device comprising providing a substrate having a sensing area and an interconnection area in the vicinity of the sensing area; forming an inter-metal dielectric (IMD) layer above the substrate in the sensing area and in the interconnection area; and forming an interconnect structure in the interconnection area. Formation of the interconnect structure comprises forming a tungsten layer in the IMD layer, and part of a top surface of the tungsten layer being exposed by at least a via; and forming a platinum layer in said at least the via, wherein the platinum (Pt) layer directly contacts said part of the top surface of the tungsten layer.

According to another aspect of the present disclosure, a method of manufacturing a semiconductor sensor is provided, comprising forming a gas-sensing device and an integrated circuit and electrically connecting the gas-sensing device to the integrated circuit, and a method of manufacturing the gas-sensing device comprising providing a substrate having a sensing area and an interconnection area in the vicinity of the sensing area; forming an inter-metal dielectric (IMD) layer above the substrate in the sensing area and in the interconnection area; forming an interconnect structure in the interconnection area; forming a sensing electrode on the IMD layer in the sensing area. Formation of the interconnect structure comprises forming a tungsten layer in the IMD layer; forming a first $TiO_2$-patterned portion on the top surface of the tungsten layer; forming a first Pt-patterned portion on the first $TiO_2$-patterned portion. The first Pt-patterned portion directly contacts the top surface of the tungsten layer. Formation of the sensing electrode comprises forming a patterned $TiO_2$ layer above the IMD layer; forming a patterned platinum (Pt) layer above the patterned $TiO_2$ layer.

DETAILED DESCRIPTION

In the embodiments of the present disclosure, a semiconductor sensor having an interconnect structure with a platinum layer contacting a tungsten layer and a method of manufacturing the same are provided. Configuration of the embodied semiconductor sensor effectively improves not only the stability of the related layers at a high temperature operation, but also the quality of the interconnect structure (i.e. no diffusion issue between Pt and W), thereby improving the properties and performance of the semiconductor sensor. Moreover, the proposed structure of the present embodiments not only significantly improves performance of the semiconductor sensor, but also is compatible with the current fabrication process of the semiconductor sensor, which is suitable for mass production.

Figure 1:
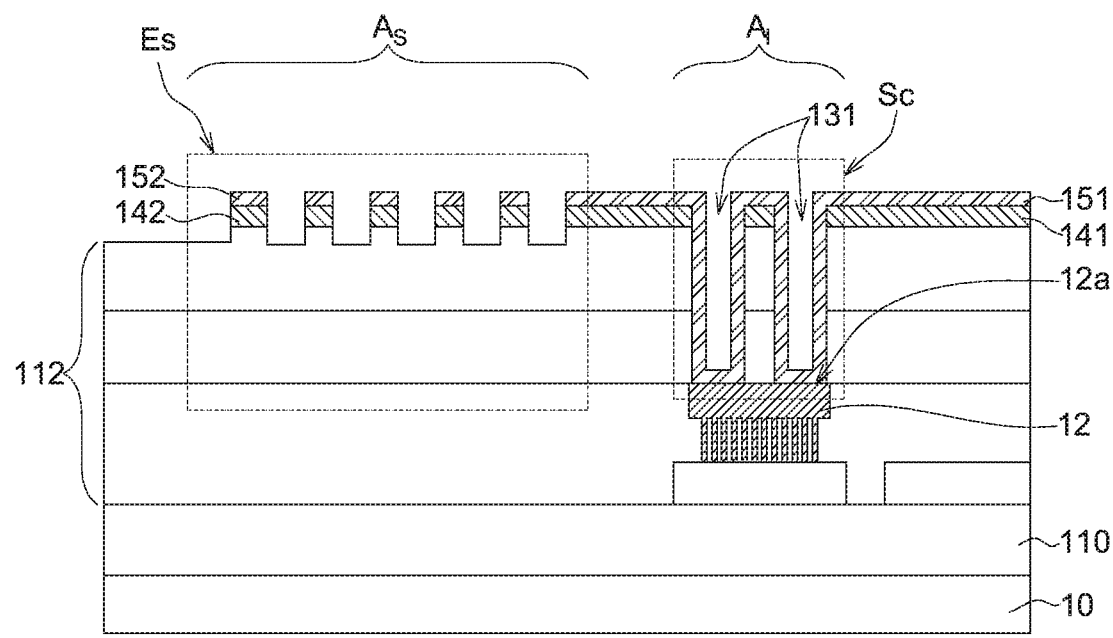
FIG. 1 simply depicts a semiconductor sensor having a gas-sensing device according to one embodiment of the present disclosure.

FIG. 1 simply depicts a semiconductor sensor having a gas-sensing device according to one embodiment of the present disclosure. In practical application, a semiconductor wafer may include several semiconductor sensors, but FIG. 1 (and the proposed drawings of the embodiments hereinafter) only schematically shows one semiconductor sensor for the purpose of clear demonstration.

According to the embodiment, a semiconductor sensor comprises a gas-sensing device (such as micro-electro-mechanical system (MEMS)) and an integrated circuit (such as the logic circuit) electrically connected to the gas-sensing device. Spatial arrangement and structural details of the gas-sensing device and the integrated circuit would be described in the following embodiments. A gas-sensing device of the embodiment comprises a substrate 10 having a sensing area $A_S$ and an interconnection area $A_I$ in the vicinity of the sensing area $A_S$; an inter-metal dielectric (IMD) layer 112 formed above the substrate 10 in the sensing area $A_S$ and in the interconnection area $A_I$; and an interconnect structure Sc formed in the interconnection area $A_I$. According to the embodiment, the interconnect structure Sc includes a tungsten (W) layer 12 buried in the IMD layer 112 and a platinum (Pt) layer 151 formed in at least a via 131. Part of a top surface 12a of the tungsten layer 12 is exposed by said at least the via 131, wherein the platinum (Pt) layer 151 directly contacts the exposed part of the top surface 12a of the tungsten layer 12. Two vias 131 are exemplified in FIG. 1, but the number of the vias is not limited thereto and can be varied according to the actual needs.

Additionally, the gas-sensing device of the embodiment further comprises a sensing electrode Es in the sensing area $A_S$. In one embodiment, the sensing electrode Es is formed on the IMD layer 112 and comprises a patterned $TiO_2$ layer 142 formed on the IMD layer 112, and a patterned platinum (Pt) layer 152 formed on the patterned $TiO_2$ layer 142.

Several embodiments are provided hereinafter with reference to the accompanying drawings for describing the related procedures and configurations. Related structural details, such as layers and spatial arrangement, are further described in the embodiments. However, the present disclosure is not limited thereto. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

Moreover, use of ordinal terms such as "first", "second", etc., in the specification and claims to describe an element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

First Embodiment

Please refer to FIG. 2A to FIG. 2F, which illustrate a method of manufacturing a semiconductor sensor according to the first embodiment of the present disclosure. In the first embodiment, the platinum layer 251 directly contacts not only the top surface 22a of the tungsten layer 22 but also the sidewalls 231b of the vias 231. Also, a semiconductor sensor with heater is exemplified.

Figure 2A:
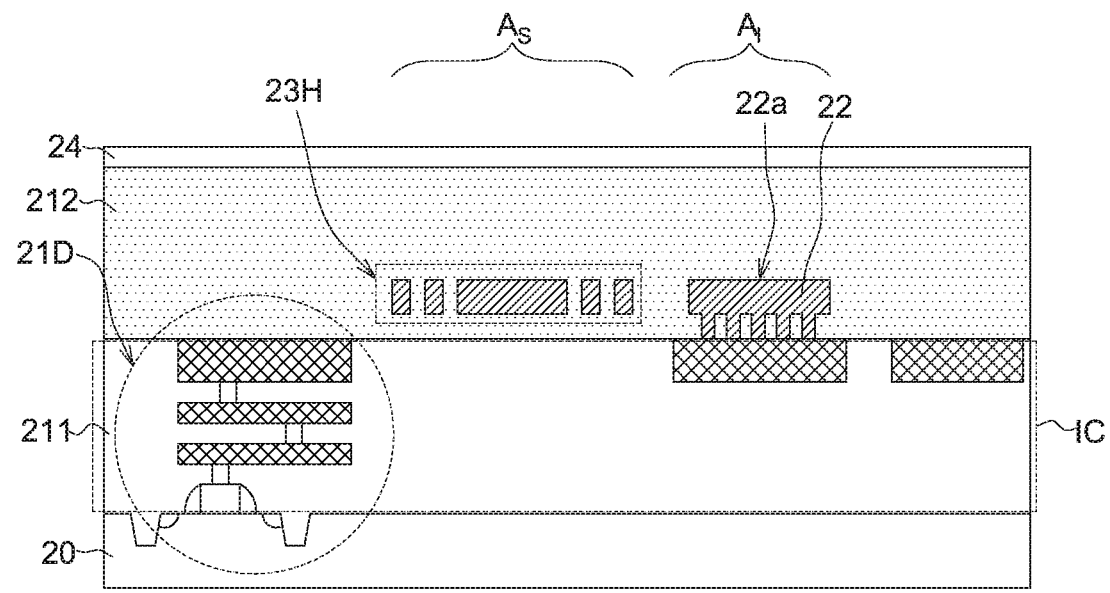
FIG. 2A-FIG. 2F illustrate a method of manufacturing a semiconductor sensor according to the first embodiment of the present disclosure.

First, a substrate 20 is provided, with an integrated circuit IC formed on the substrate 20 and buried in an insulating layer 211 (ex: ILD/IMD), as shown in FIG. 2A. The integrated circuit IC (having a logic device 21D, for example) is electrically connected to a gas-sensing device fabricated later. Moreover, the gas-sensing device of the first embodiment further comprises a heater 23H in the sensing area $A_S$, and the heater 23H is buried in the IMD layer 212, wherein the heater 23H is spaced apart from the tungsten layer 22 in the interconnection area $A_I$. The heater 23H is electrically connected to the interconnect structure Sc by routing, which is not shown in the drawing. A method of manufacturing the gas-sensing device of the first embodiment is described below.

Figure 2B:
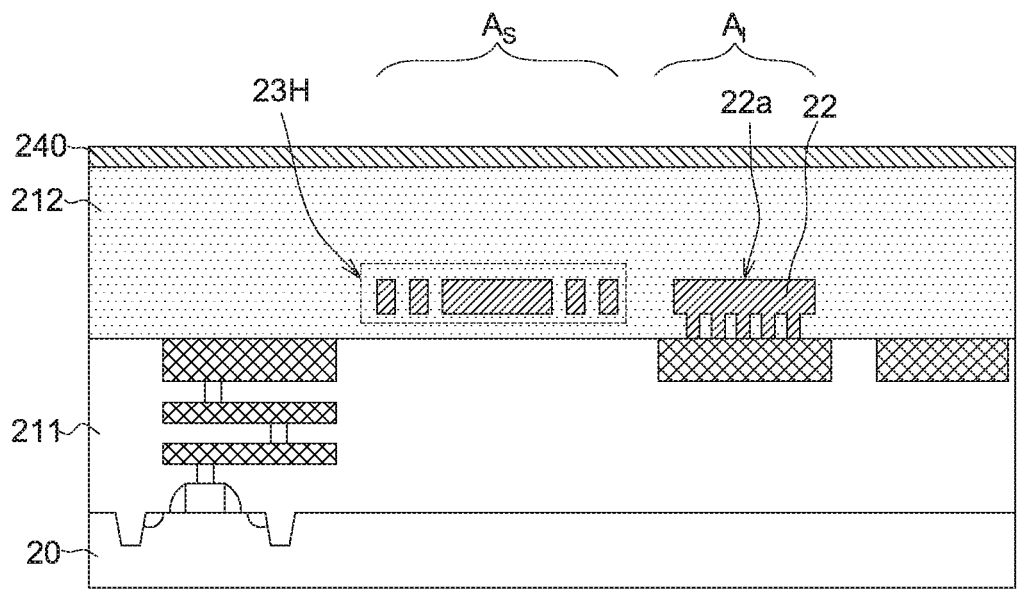

As shown in FIG. 2A, a titanium (Ti) layer 24 is formed on the IMD layer 212, such as by deposition. Also, the titanium layer is deposited in the sensing area $A_S$ and in the interconnection area $A_I$. Then, the titanium layer 24 is oxidized at a sufficient high temperature to form a $TiO_2$ layer 240, as shown in FIG. 2B. Oxidation of the titanium layer 24 can be performed in furnace. In one embodiment, the temperature of Ti oxidation is in a range of 300° C. to 450° C.

Figure 2C:
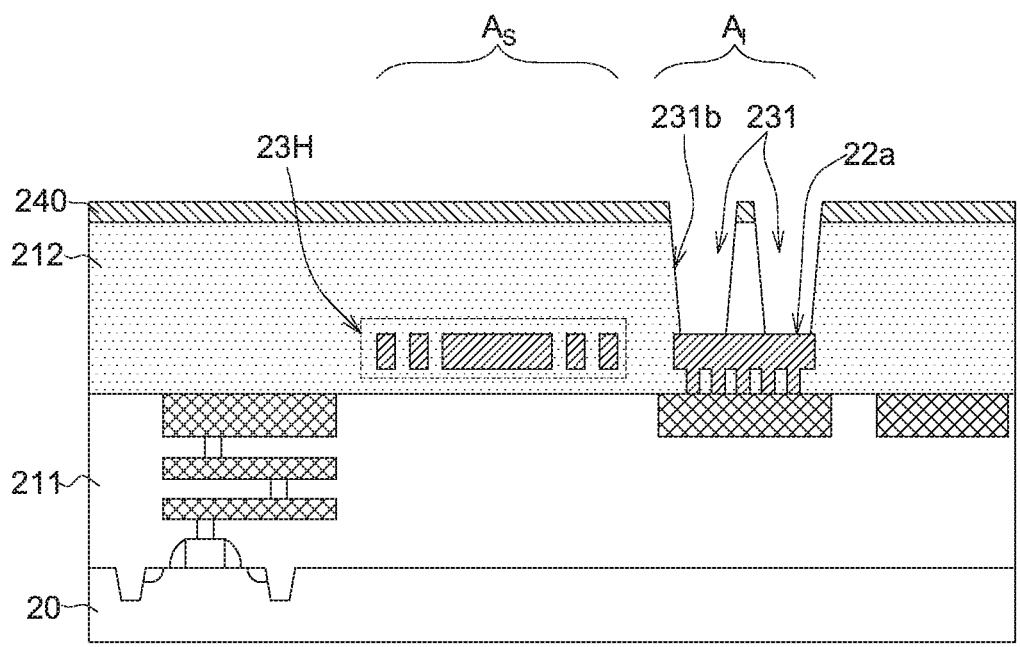
Figure 2D:
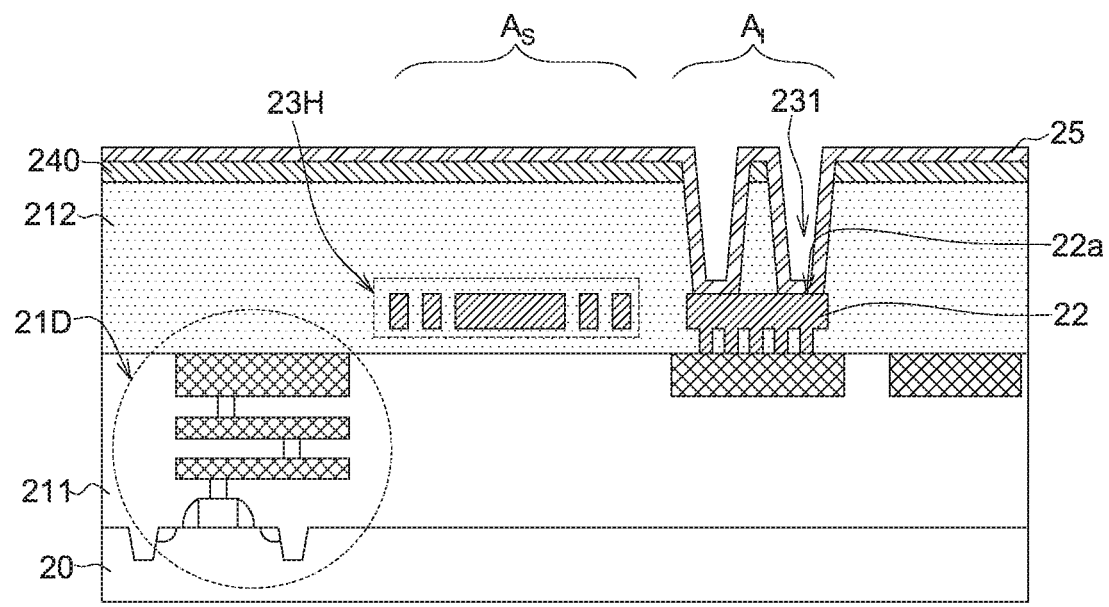

Next, the $TiO_2$ layer 240 and the IMD layer 212 are etched to form the vias 231 in the interconnection area $A_I$, wherein the vias 231 expose parts of the top surface 22a of the tungsten layer 22, as shown in FIG. 2C. Then, a platinum (Pt) layer 25 is formed on the $TiO_2$ layer 240 and the sidewalls 231b of the vias 231, so that the platinum (Pt) layer 25 directly contacts the top surface 22a of the tungsten layer 22, as shown in FIG. 2D.

Figure 2E:
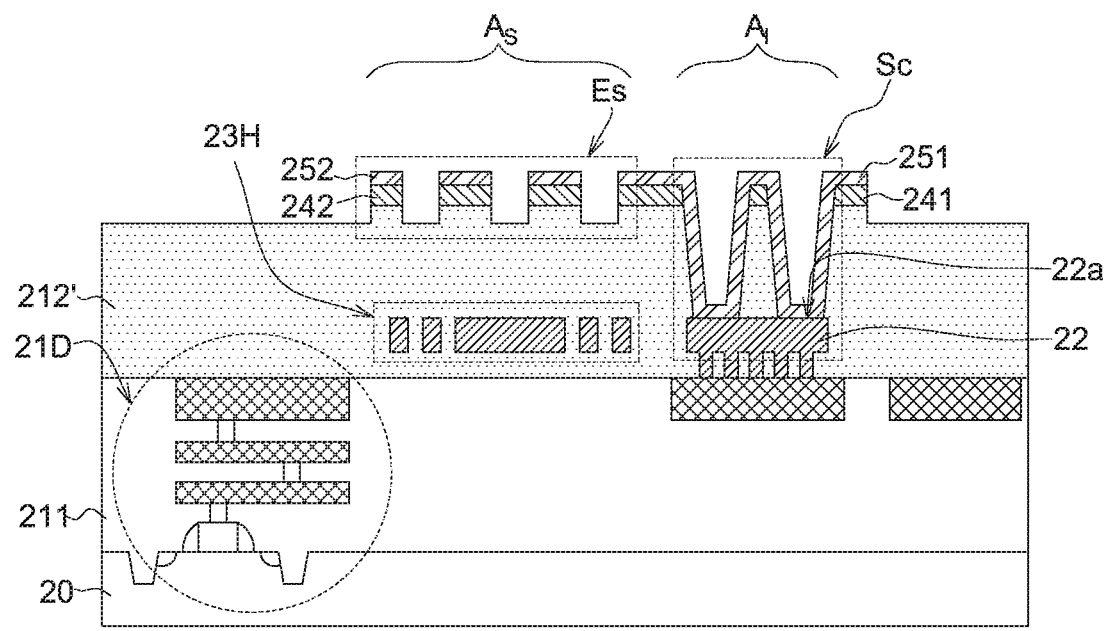

Afterwards, the platinum (Pt) layer 25 and the $TiO_2$ layer 240 are patterned to form a sensing electrode Es in the sensing area $A_S$ and the interconnect structure Sc in the interconnection area $A_I$, as shown in FIG. 2E. In the first embodiment, after Pt patterning, the interconnect structure Sc comprises the tungsten layer 22 buried in the IMD layer 212, the $TiO_2$ layer 241 formed on the IMD layer 212 adjacent to the vias 231, and the platinum layer 251 directly formed on the $TiO_2$ layer 241 and at the sidewalls 231b and the bottom of the vias 231, wherein the platinum layer 251 directly contacts the top surface 22a of the tungsten layer 22. Moreover, after Pt patterning, the sensing electrode Es of the gas-sensing device includes a patterned $TiO_2$ layer 242 formed on the IMD layer 212', and a patterned platinum (Pt) layer 252 formed on the patterned TiO₂ layer 242. Also, the heater 23H is positioned correspondingly to (ex: beneath) the sensing electrode Es.

According to the method of the first embodiment, since the platinum layer 251 and the patterned platinum layer 252 are formed simultaneously by patterning the Pt layer 25, the platinum layer 251 of the interconnect structure Sc further extends to the sensing area $A_S$ as shown in FIG. 2E, wherein the patterned Pt layer 252 of the sensing electrode Es are physically connected to the platinum layer 251 of the interconnect structure Sc.

Figure 2F:
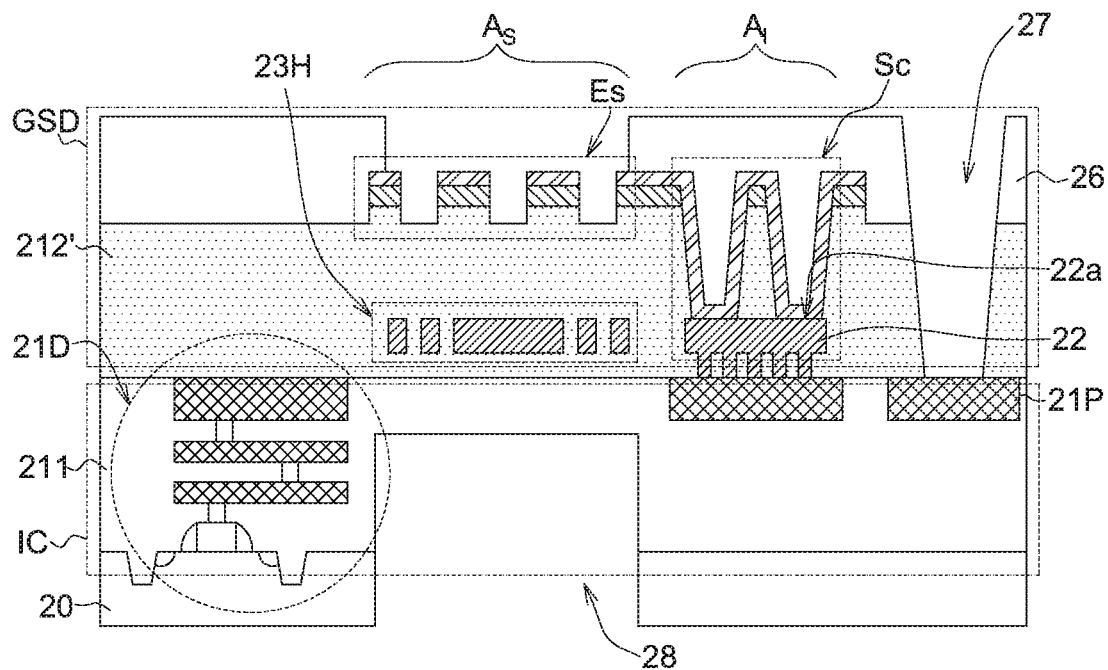

Afterwards, a passivation layer 26 is formed on the IMD layer 212' to filled up the vias 231 in the interconnection area $A_I$, followed by patterning the passivation layer 26 so as to expose the sensing electrode Es in the sensing area $A_S$ and form an opening 27 in the pad region (ex: exposing a pad 21P). Then, a cavity 28 is formed as shown in FIG. 2F (for example, a portion of the substrate 20 is removed by etching to form the cavity 28 correspondingly to the sensing electrode Es). In the first embodiment, the integrated circuit IC (ex. including the logic device 21D electrically connected to the gas-sensing device GSD) is positioned beneath the gas-sensing device GSD, and is positioned between the substrate 20 and the gas-sensing device GSD, as shown in FIG. 2F.

Additionally, the gas-sensing device GSD of the embodiment further comprises a gas sensing layer (not shown in FIG. 2F) formed on (ex: cover) the sensing electrode so as to span the sensing electrode. In one example, the gas sensing layer can be formed on the sensing electrode Es after formation of the cavity 28. For a semiconductor sensor, the gas-sensitive layer (ex: a MOS layer) deposited on the sensing electrode is capable of absorbing a gas, depending on the material of the gas sensing layer. The gas sensing layer can be deposited by sputtering, or can be electrochemically grown on the sensing electrode Es. Also, the gas sensing layer can be made of an inorganic material such as metal oxide (ex: tin oxide), or can be made of an organic material (such as a polymer or phthalocyanine). When the gas interacts with the gas sensing layer, the conductivity of the gas sensing layer changes, and this can be detected by appropriate circuitry. Therefore, the gas-sensing device GSD of the semiconductor sensor, comprising the sensing electrode Es and the gas-sensitive layer and the interconnect structure Sc, provides an electrical output indicative of gas reaction with the gas-sensitive layer. An electrical output indicative of gas reaction with the gas-sensitive layer is transmitted to the integrated circuit IC through the interconnect structure Sc to carry out the logic operation. The heater 23H is provided for heating the gas sensing layer to promote gas reaction with the gas sensing layer. Although the first embodiment provides a tungsten (W) heater 23H, which can be fabricated with the tungsten layer 22 of the interconnect structure Sc by using the same W material layer, it is noted that the heater 23H can be formed of tungsten or other suitable materials, and the disclosure is not limited thereto.

Second Embodiment

Please refer to FIG. 3A to FIG. 3F, which illustrate a method of manufacturing a semiconductor sensor according to the second embodiment of the present disclosure. In the second embodiment, the platinum layer 251 of the interconnect structure Sc directly contacts not only the top surface 22a of the tungsten layer 22 but also the sidewalls 231b of the vias 231. Also, the second embodiment provides a Pt/TiO₂ heater, which can be fabricated with the Pt/TiO₂ layer of the interconnect structure Sc by using the same Pt/TiO₂ material layers. Also, the identical and/or similar elements of the second and first embodiments are designated with the same and/or similar reference numerals, and the details of the configurations, procedures and working principles of the identical components/layers are not redundantly described.

Figure 3A:
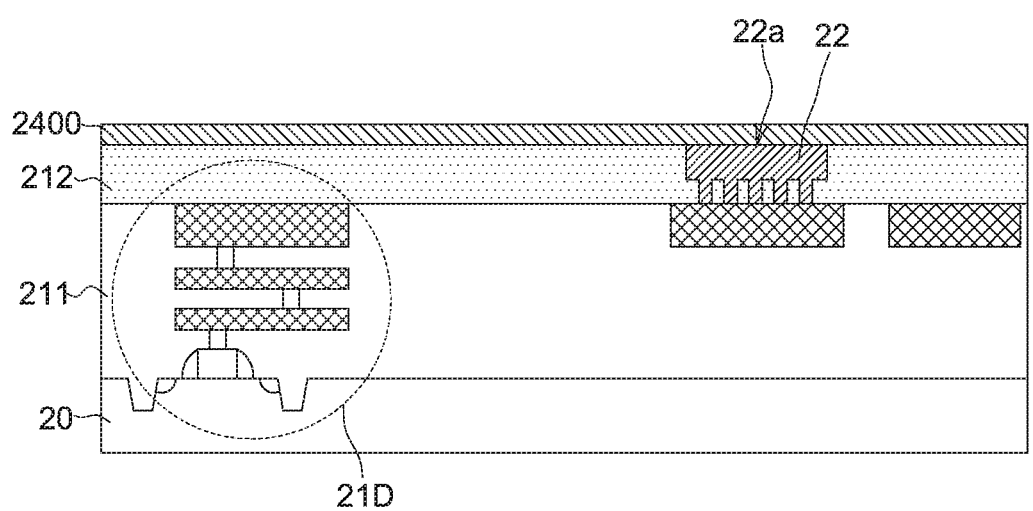
FIG. 3A-FIG. 3F illustrate a method of manufacturing a semiconductor sensor according to the second embodiment of the present disclosure.
Figure 3B:
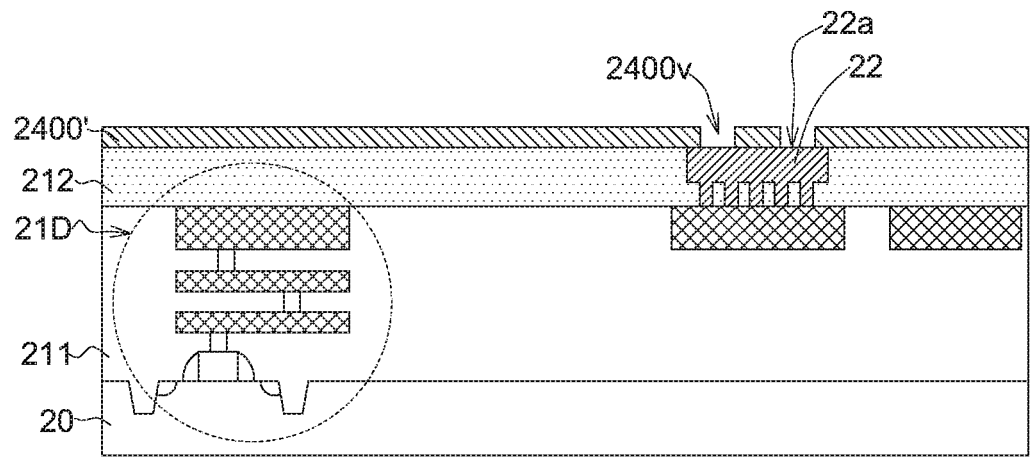
Figure 3C:
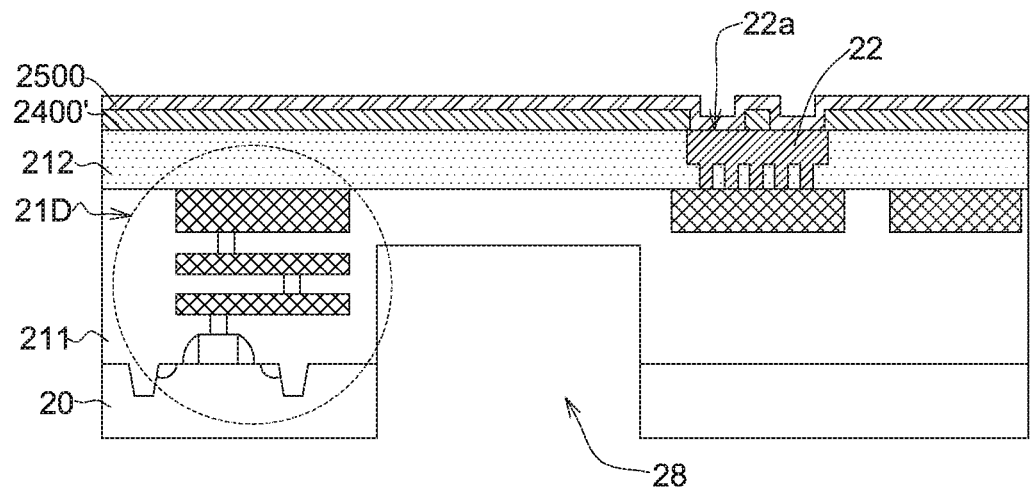

As shown in FIG. 3A, Ti deposition and oxidation (ex: at a temperature ranged from 300° C. to 450° C.) is conducted to form a TiO₂ layer 2400 on the IMD layer 212. Then, the TiO₂ layer 2400 is patterned (ex: by etching) to form a patterned TiO₂ layer 2400' for opening the tungsten layer 22, as shown in FIG. 3B. A platinum layer 2500 is formed on the patterned TiO₂ layer 2400' and fills up the openings 2400v of the patterned TiO₂ layer 2400', so that the platinum layer 2500 directly contacts the top surface 22a of the tungsten layer 22, as shown in FIG. 3C.

Figure 3D:
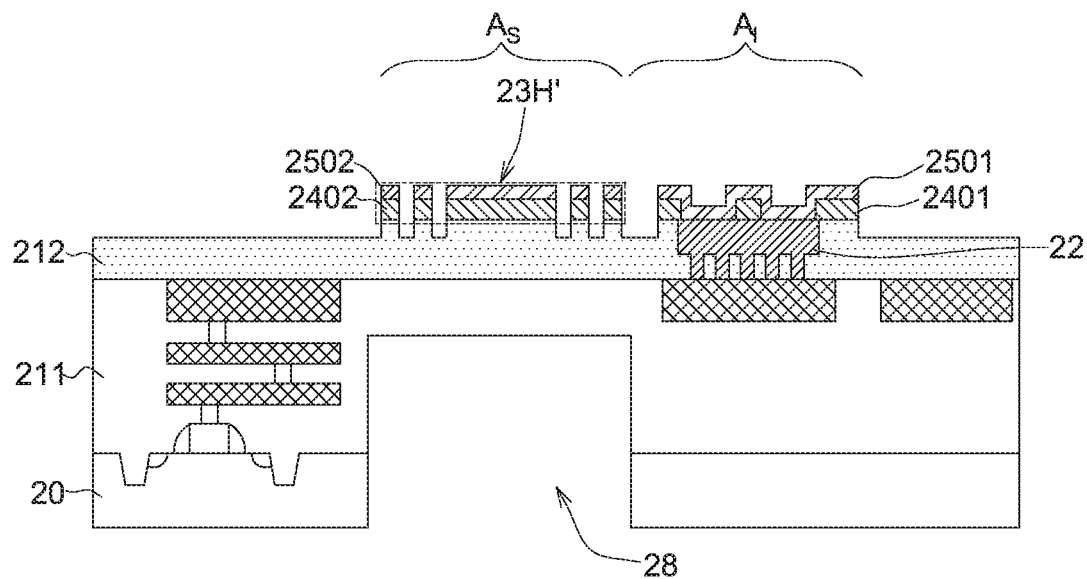
Figure 3E:
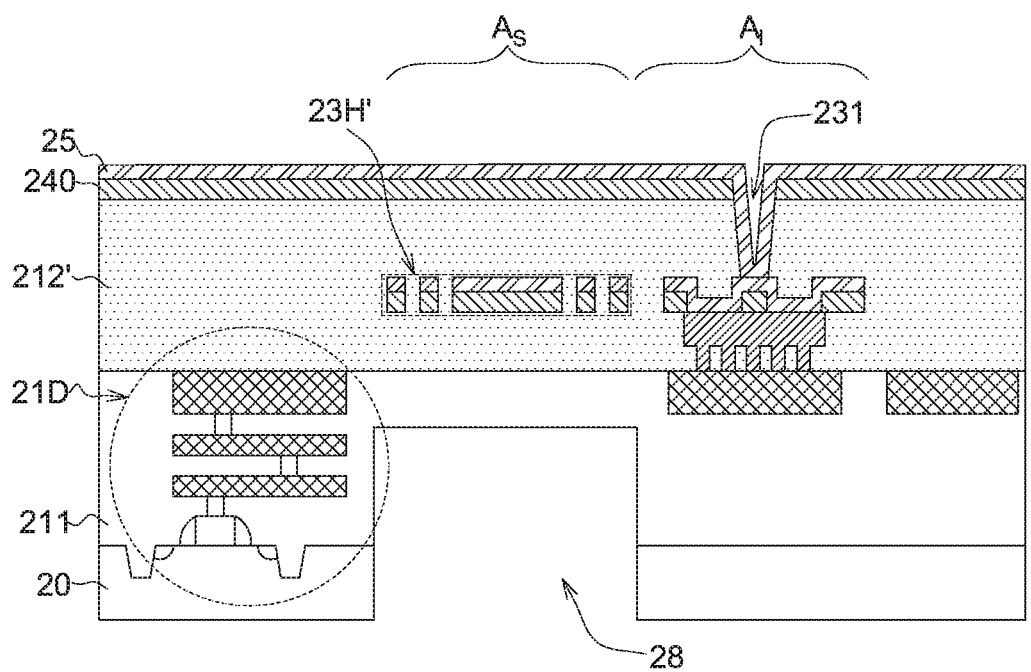
Figure 3F:
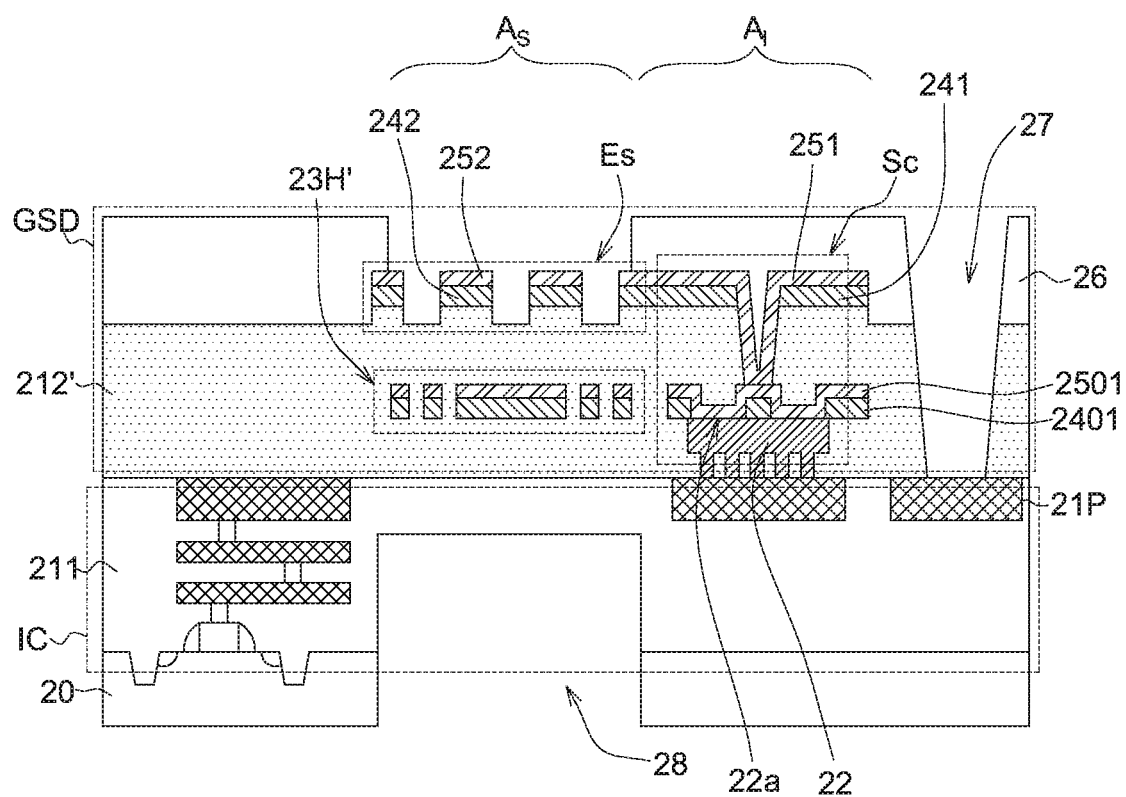

Next, the patterned TiO₂ layer 2400' and the platinum layer 2500 are patterned to form a Pt/TiO₂ heater 23H' and a Pt/TiO₂ multi-layer of the interconnect structure Sc, as shown in FIG. 3D. Then, the material of the IMD layer 212 is further formed to cover the Pt/TiO₂ heater 23H' and the Pt/TiO₂ multi-layer of the interconnect structure Sc (i.e. forming a thickened IMD layer 212'), followed by formation and patterning of another TiO₂ (ex: Ti deposition and oxidation) and another platinum layer, as shown in FIG. 3E. Afterwards, formation of the passivation layer 26, formation of the opening 27 in the pad region (ex: exposing a pad 21P), and removal of a portion of the substrate 20 for forming the cavity 28, are conducted, as shown in FIG. 3F. The steps for forming the structure of FIG. 3F are similar to that of FIG. 2F, which are not repeated herein.

According to the second embodiment, the interconnect structure Sc in the interconnection area $A_I$ comprise a first TiO₂-patterned portion 2401 formed on the top surface 22a of the tungsten layer 22 and a first Pt-patterned portion 2501 formed on the first TiO₂-patterned portion 2401, wherein the first Pt-patterned portion 2501 directly contacts the top surface 22a of the tungsten layer 22. According to the second embodiment, the gas-sensing device GSD in the sensing area $A_S$ further comprises a second TiO₂-patterned portion 2402 (buried in the thickened IMD layer 212' and positioned below the sensing electrode Es), and a second Pt-patterned portion 2502 directly formed on the second TiO₂-patterned portion 2402, wherein the second Pt-patterned portion 2502 acts as a heater of the gas-sensing device GSD of the second embodiment. As shown in FIG. 3E and FIG. 3F, the platinum layer 251 in the vias 231 directly contacts the first Pt-patterned portion 2501, so as to form a direct connection between Pt and W of the interconnect structure Sc in the interconnection area $A_I$.

Accordingly, the first embodiment uses W as the material of the heater 23H and Pt as the material of the sensing electrode Es. The second embodiment uses Pt as the material of the heater 23H' and the sensing electrode Es.

Third Embodiment

In the first and second embodiment, the integrated circuits IC, including the logic device 21D electrically connected to the gas-sensing device GSD, are positioned beneath the gas-sensing devices GSD (ex: the integrated circuits IC positioned between the substrate 20 and the gas-sensing device GSD), as shown in FIG. 2F and FIG. 3F. However, the disclosure is not limited thereto. The gas-sensing devices GSD and the integrated circuit IC can be formed on the different chips and electrically connected to each other by wire bonding, as exemplified in the third embodiment.

Figure 4:
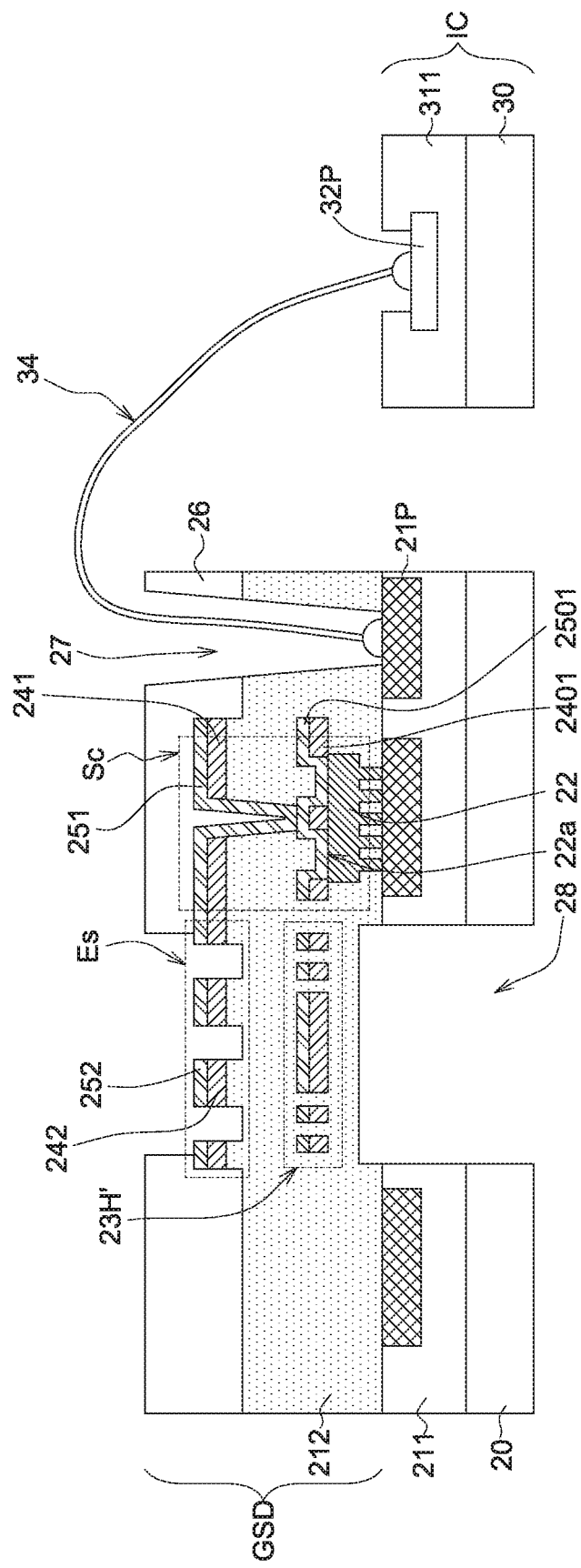
FIG. 4 illustrates a semiconductor sensor according to the third embodiment of the present disclosure.

FIG. 4 illustrates a semiconductor sensor according to the third embodiment of the present disclosure. In FIG. 4, a gas-sensing device GSD (exemplified by, but not limited to, the gas-sensing device GSD of the second embodiment, as shown in FIG. 3F) is formed on the substrate 20 while an integrated circuit IC (having another pad 32P, for example) is formed on another substrate 30. The gas-sensing devices GSD and the integrated circuit IC formed on the different chips are connected to each other by the bonding the pads 21P and 32P through the wire 34.

Fourth Embodiment

Figure 5:
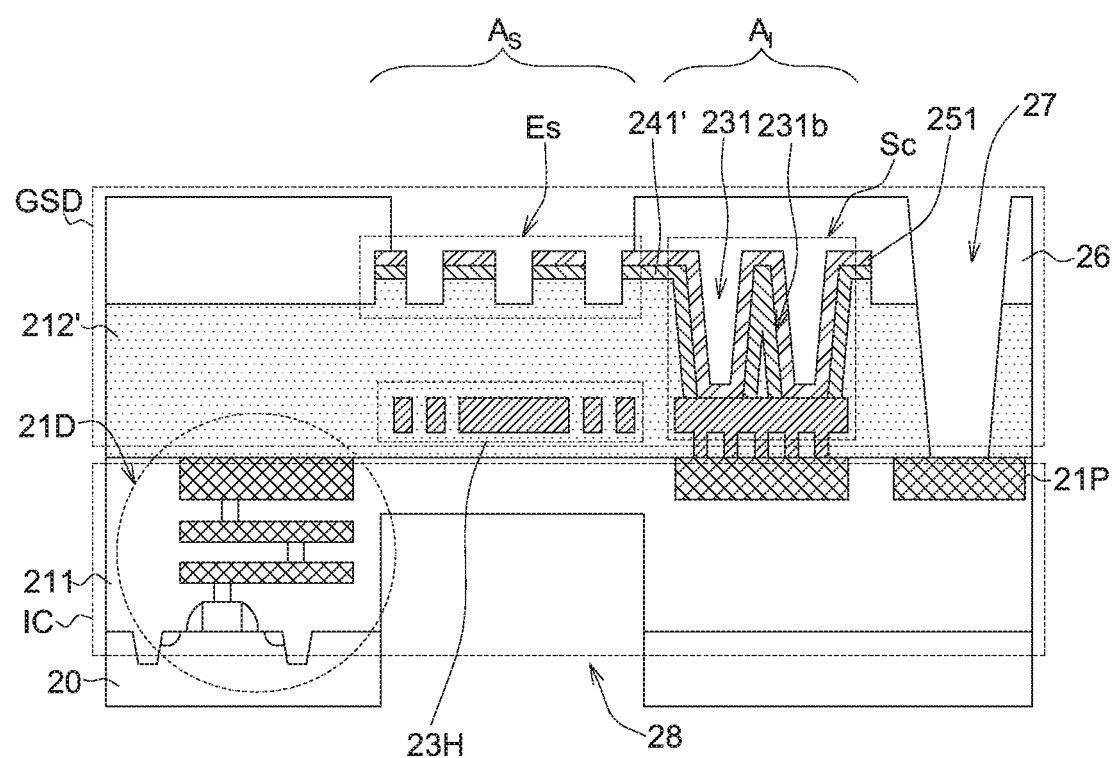
FIG. 5 illustrates a semiconductor sensor according to the fourth embodiment of the present disclosure.

In the first to third embodiments, the drawings depict that the platinum layer 251 of the interconnect structure Sc directly contact the sidewalls 231b of the vias 231. However, the disclosure is not limited thereto. In an alternative configuration, it is also applicable by forming a $TiO_2$ layer on the sidewalls 231b of the via 231 but not on the top surface 22a of the tungsten layer 22. FIG. 5 illustrates a semiconductor sensor according to the fourth embodiment of the present disclosure. The semiconductor sensor of the fourth embodiment is identical to the semiconductor sensor of the first embodiment (FIG. 2F), except for the positions of the $TiO_2$ layers 241' and 241. Details of the identical elements (designated with the same reference numerals) of the fourth and first embodiments are not redundantly described.

As shown in FIG. 5, the $TiO_2$ layer 241' is formed on the sidewalls 231b of the via 231 but not formed on the top surface 22a of the tungsten layer 22, and the platinum layer 251 also directly contacts the top surface 22a of the tungsten layer 251. The semiconductor sensor of the fourth embodiment can be manufactured by slightly modifying the method for manufacturing that of the first embodiment (please also refer to FIG. 2A-FIG. 2F for the related layers as mentioned herein). For example, the interconnect structure Sc in the interconnection area $A_I$ according to the fourth embodiment may include steps of etching the IMD layer 212 to form the vias 231 to expose part of the top surface 22a of the tungsten layer 22; forming a titanium layer 24 on the IMD layer 212 and extending as a Ti-liner in the vias 231; oxidizing the titanium layer 24 (ex: at 300° C. to 450° C.) to form a $TiO_2$ layer 240 on the IMD layer 212 and a $TiO_2$-liner in the vias 231; removing a bottom portion of the $TiO_2$-liner to expose the top surface 22a of the tungsten layer 22; and forming a platinum layer on the $TiO_2$ layer and extending to the vias 231 to form a Pt-liner in the vias 231, wherein the Pt-liner in the vias 231 directly contact the top surface 22a of the tungsten layer 22.

According to the aforementioned descriptions, the semiconductor sensors of the embodiments possess several advantages. Since the gas-sensing device is operated at a high temperature, the stability of the related layers of the gas-sensing device at high temperature would be one of important factors for the performance of the gas-sensing device. During operation of the gas-sensing device having a heater, $TiO_2$ is more stable than Ti or TiN at a high temperature. Accordingly, compared to the conventional gas-sensing device (ex: using Ti or TiN as a barrier/adhesion layer below a platinum (Pt) layer), the embodied gas-sensing device of the semiconductor sensors having the $TiO_2$ as the barrier/adhesion layer would be more stable at a high temperature operation. Also, according to the design of the embodied gas-sensing device, the Pt layer 251 directly contacts the W layer 22, and there is no diffusion issue between Pt and W. Therefore, the proposed embodiments significantly improve the properties and performances of the semiconductor sensor in the applications. Moreover, the method for manufacturing the proposed structure of the embodiments is compatible with the current fabrication process of the semiconductor sensor, which is suitable for mass production. For example, in one of practical applications, the W layer 22 can be fabricated with a heater 23H by patterning the same tungsten layer, which is easy and time-saving.

Other embodiments with different configurations of known elements in the semiconductor sensor can be applicable, and the arrangement depends on the actual needs of the practical applications. It is, of course, noted that the configurations of figures are depicted only for demonstration, not for limitation. It is known by people skilled in the art that the shapes or positional relationship of the constituting elements and the procedure details could be adjusted according to the requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor sensor, comprising a gas-sensing device and an integrated circuit electrically connected to the gas-sensing device, and the gas-sensing device comprising:
   a substrate having a sensing area and an interconnection area in the vicinity of the sensing area;
   an inter-metal dielectric (IMD) layer formed above the substrate in the sensing area and in the interconnection area;
   an interconnect structure formed in the interconnection area, and the interconnect structure comprising:
      a tungsten layer buried in the IMD layer;
      a first $TiO_2$-patterned portion formed on the top surface of the tungsten layer; and
      a first Pt-patterned portion formed on the first $TiO_2$-patterned portion and directly contacting the top surface of the tungsten layer; and
   a sensing electrode formed on the IMD layer in the sensing area, and the sensing electrode comprises:
      a patterned $TiO_2$ layer formed above the IMD layer; and
      a patterned platinum (Pt) layer formed above the patterned $TiO_2$ layer,
   wherein the integrated circuit is positioned between the substrate and the gas-sensing device.

2. The semiconductor sensor according to claim 1, wherein part of a top surface of the first Pt-patterned portion is exposed by at least a via, the interconnect structure comprises a platinum (Pt) layer formed in said at least the via and a $TiO_2$ layer formed on the IMD layer adjacent to said at least the via, and the platinum layer is directly formed on the $TiO_2$ layer above the IMD layer.

3. The semiconductor sensor according to claim 2, wherein the platinum layer further directly contact sidewalls of said at least the via.

4. The semiconductor sensor according to claim 2, wherein the platinum layer of the interconnect structure and the patterned Pt layer of the sensing electrode are physically connected.

5. The semiconductor sensor according to claim 1, wherein a portion of the substrate in the sensing area is removed.

6. The semiconductor sensor according to claim 1, wherein the gas-sensing device further comprises a gas sensing layer formed on the sensing electrode so as to span the sensing electrode.

7. The semiconductor sensor according to claim 1, wherein the gas-sensing device in the sensing area further comprises:
- a second $TiO_2$-patterned portion buried in the IMD layer and positioned below the sensing electrode; and
- a second Pt-patterned portion directly formed on the second $TiO_2$-patterned portion, wherein the second Pt-patterned portion acts as a heater of the gas-sensing device.

8. The semiconductor sensor according to claim 7, wherein the heater in the IMD layer is electrically connected to the tungsten layer in the interconnection area.

9. The semiconductor sensor according to claim 2, further comprising a passivation layer formed on the IMD layer to fill up said at least the via in the interconnection area and expose the sensing electrode in the sensing area.

10. A semiconductor sensor, comprising a gas-sensing device and an integrated circuit electrically connected to the gas-sensing device, and the gas-sensing device comprising:
- a substrate having a sensing area and an interconnection area in the vicinity of the sensing area;
- an inter-metal dielectric (IMD) layer formed above the substrate in the sensing area and in the interconnection area;
- an interconnect structure formed in the interconnection area, and the interconnect structure comprising:
  - a tungsten layer buried in the IMD layer;
  - a first $TiO_2$-patterned portion formed on the top surface of the tungsten layer; and
  - a first Pt-patterned portion formed on the first $TiO_2$-patterned portion and directly contacting the top surface of the tungsten layer; and
- a sensing electrode formed on the IMD layer in the sensing area, and the sensing electrode comprises:
  - a patterned $TiO_2$ layer formed above the IMD layer; and
  - a patterned platinum (Pt) layer formed above the patterned $TiO_2$ layer, wherein the gas-sensing device and the integrated circuit are formed as different chips and electrically connected to each other by wire bonding.

* * * * *